United States Patent
Yoo et al.

(10) Patent No.: US 10,062,855 B2
(45) Date of Patent: *Aug. 28, 2018

(54) ADHESIVE AND METHOD OF ENCAPSULATING ORGANIC ELECTRONIC DEVICE USING THE SAME

(71) Applicant: LG CHEM, LTD., Seoul (KR)

(72) Inventors: Hyun Jee Yoo, Daejeon (KR); Yoon Gyung Cho, Daejeon (KR); Suk Ky Chang, Daejeon (KR); Jung Sup Shim, Daejeon (KR); Suk Chin Lee, Daejeon (KR); Kwang Jin Jeong, Chungbuk (KR)

(73) Assignee: LG Chem, Ltd., Seoul (KR)

(*) Notice: Subject to any disclaimer, the term of this patent is extended or adjusted under 35 U.S.C. 154(b) by 13 days.

This patent is subject to a terminal disclaimer.

(21) Appl. No.: 14/740,006

(22) Filed: Jun. 15, 2015

(65) Prior Publication Data
US 2015/0287940 A1    Oct. 8, 2015

Related U.S. Application Data

(63) Continuation of application No. 14/289,212, filed on May 28, 2014, now Pat. No. 9,105,648, which is a (Continued)

(30) Foreign Application Priority Data

Nov. 2, 2010  (KR) .................. 10-2010-0108113
Jan. 14, 2011  (KR) .................. 10-2011-0004054
Nov. 2, 2011  (KR) .................. 10-2011-0113121

(51) Int. Cl.
*H01L 33/00*    (2010.01)
*H01L 29/08*    (2006.01)
(Continued)

(52) U.S. Cl.
CPC ............ *H01L 51/0094* (2013.01); *C09J 7/00* (2013.01); *C09J 7/10* (2018.01); *C09J 7/35* (2018.01);
(Continued)

(58) Field of Classification Search
CPC . H01L 51/5246; H01L 51/56; H01L 51/5256; H01L 51/5259; H01L 21/56;
(Continued)

(56) References Cited

U.S. PATENT DOCUMENTS 3,853,595 A * 12/1974 Pedginski ............ C09J 7/0275
                                                    33/2 R
6,692,986 B1 * 2/2004 Bayer ................. H01L 51/5246
                                                    438/116
(Continued)

FOREIGN PATENT DOCUMENTS

CN        1992371        7/2007
CN     101243151 A       8/2008
(Continued)

OTHER PUBLICATIONS

"Ti-Pure Titanium Dioxide Polymers, Light and the Science of TiO2", Jun. 1, 2007, pp. 1-16, XP055165047.

*Primary Examiner* — Joseph C Nicely
*Assistant Examiner* — Wilner Jean Baptiste
(74) *Attorney, Agent, or Firm* — Dentons US LLP

(57) ABSTRACT

An adhesive, and an encapsulated product and method of encapsulating an organic electronic device (OED) using the same are provided. The adhesive film serves to encapsulate the OED and includes a curable resin and a moisture absorbent, and the adhesive includes a first region coming in contact with the OED upon encapsulation of the OED and a second region not coming in contact with the OED. Also, the moisture absorbent is present at contents of 0 to 20% and 80

(Continued)

to 100% in the first and second regions, respectively, based on the total weight of the moisture absorbent in the adhesive.

27 Claims, 3 Drawing Sheets

Related U.S. Application Data continuation of application No. 13/886,098, filed on May 2, 2013, now Pat. No. 8,742,411, which is a continuation of application No. PCT/KR2011/008280, filed on Nov. 2, 2011.

(51) Int. Cl.

| | | |
|---|---|---|
| H01L 51/00 | (2006.01) | |
| H01L 21/00 | (2006.01) | |
| H01L 51/52 | (2006.01) | |
| H05B 33/04 | (2006.01) | |
| H01L 51/56 | (2006.01) | |
| C09J 7/00 | (2018.01) | |
| C09J 163/00 | (2006.01) | |
| H01L 21/56 | (2006.01) | |
| H01L 23/28 | (2006.01) | |
| H01L 23/29 | (2006.01) | |
| H01L 23/00 | (2006.01) | |
| C09J 9/00 | (2006.01) | |
| C09J 11/04 | (2006.01) | |
| C09J 7/35 | (2018.01) | |
| C09J 7/10 | (2018.01) | |
| C08K 3/22 | (2006.01) | |
| C08K 3/34 | (2006.01) | |
| C08K 3/36 | (2006.01) | |
| C08K 3/16 | (2006.01) | |

(52) U.S. Cl.
CPC .............. *C09J 9/00* (2013.01); *C09J 11/04* (2013.01); *C09J 163/00* (2013.01); *H01L 21/56* (2013.01); *H01L 23/28* (2013.01); *H01L 23/295* (2013.01); *H01L 23/564* (2013.01); *H01L 51/0035* (2013.01); *H01L 51/5246* (2013.01); *H01L 51/5253* (2013.01); *H01L 51/5256* (2013.01); *H01L 51/5259* (2013.01); *H01L 51/56* (2013.01); *H05B 33/04* (2013.01); *C08K 3/16* (2013.01); *C08K 3/22* (2013.01); *C08K 3/346* (2013.01); *C08K 3/36* (2013.01); *C08K 2003/162* (2013.01); *C08K 2003/166* (2013.01); *C08K 2003/2206* (2013.01); *C09J 2201/134* (2013.01); *C09J 2201/36* (2013.01); *C09J 2201/61* (2013.01); *C09J 2203/326* (2013.01); *C09J 2205/102* (2013.01); *C09J 2463/00* (2013.01); *H01L 51/0034* (2013.01); *H01L 2251/301* (2013.01); *H01L 2251/303* (2013.01); *H01L 2924/0002* (2013.01)

(58) Field of Classification Search
CPC ..... H01L 23/28; H01L 23/295; H01L 23/564; H01L 51/0035; H05B 33/04; C09J 163/00; C09J 7/00; C09J 7/0203; C09J 11/04; C09J 9/00; C09J 51/0094; C09J 2924/0002
USPC .................................................. 257/40, 100
See application file for complete search history.

(56) References Cited

U.S. PATENT DOCUMENTS

| | | | | |
|---|---|---|---|---|
| 6,740,145 B2* | 5/2004 | Boroson | ............... | F26B 21/083 |
| | | | | 206/204 |
| 6,849,922 B2 | 2/2005 | Park | | |
| 7,417,867 B1* | 8/2008 | Matsuda | ............. | H05K 3/0094 |
| | | | | 174/255 |
| 7,462,390 B2* | 12/2008 | Kim | ........................ | C09J 133/14 |
| | | | | 349/149 |
| 8,003,999 B2 | 8/2011 | Cho et al. | | |
| 8,016,631 B2 | 9/2011 | Boroson et al. | | |
| 8,421,351 B2* | 4/2013 | Kanazawa | ............. | B82Y 20/00 |
| | | | | 313/504 |
| 9,806,287 B2* | 10/2017 | Yoo | ...................... | H01L 51/5253 |
| 2002/0145128 A1* | 10/2002 | Sakaguchi | .......... | H01L 51/5259 |
| | | | | 252/181.3 |
| 2003/0037677 A1 | 2/2003 | Boroson et al. | | |
| 2003/0143423 A1* | 7/2003 | McCormick | ........ | H01L 51/5237 |
| | | | | 428/690 |
| 2005/0249901 A1* | 11/2005 | Yializis | ..................... | B32B 7/02 |
| | | | | 428/35.7 |
| 2006/0182947 A1* | 8/2006 | Jerri | ...................... | B29C 70/025 |
| | | | | 428/316.6 |
| 2007/0152212 A1* | 7/2007 | Cho | ..................... | H01L 51/5237 |
| | | | | 257/40 |
| 2008/0143247 A1 | 6/2008 | Kim et al. | | |
| 2008/0238303 A1* | 10/2008 | Lee | ..................... | H01L 51/5246 |
| | | | | 313/504 |
| 2008/0258605 A1* | 10/2008 | Yukinobu | ............. | H01L 51/442 |
| | | | | 313/504 |
| 2008/0309226 A1* | 12/2008 | Kim | ..................... | H01L 51/5256 |
| | | | | 313/504 |
| 2010/0072606 A1* | 3/2010 | Yang | ..................... | H01L 23/481 |
| | | | | 257/692 |
| 2010/0123160 A1* | 5/2010 | Hatano | ............... | H01L 27/3251 |
| | | | | 257/99 |
| 2010/0304160 A1* | 12/2010 | Fukukawa | ......... | C08G 73/1007 |
| | | | | 428/458 |
| 2011/0073901 A1* | 3/2011 | Fujita | .................... | C09D 165/00 |
| | | | | 257/100 |
| 2011/0132449 A1* | 6/2011 | Ramadas | ............... | H05B 33/04 |
| | | | | 136/256 |
| 2011/0147789 A1* | 6/2011 | Lee | ..................... | H01L 51/5253 |
| | | | | 257/100 |
| 2011/0266578 A1 | 11/2011 | Kanisawa et al. | | |

FOREIGN PATENT DOCUMENTS

| | | |
|---|---|---|
| CN | 101260223 A | 9/2008 |
| CN | 101855744 | 10/2010 |
| EP | 1804310 A2 | 7/2007 |
| JP | 07254486 | 10/1995 |
| JP | 09-148066 | 6/1997 |
| JP | 2002-260847 | 9/2002 |
| JP | 2004-139977 | 5/2004 |
| JP | 2004-335208 | 11/2004 |
| JP | 2004323619 A | 11/2004 |
| JP | 2005-339863 | 12/2005 |
| JP | 2006183002 A | 7/2006 |
| JP | 2007-005047 | 1/2007 |
| JP | 2007-035331 | 2/2007 |
| JP | 2007-042612 | 2/2007 |
| JP | 2007-184279 A | 7/2007 |
| JP | 2007234380 A | 9/2007 |
| JP | 2008027814 A | 2/2008 |
| JP | 2008181832 | 7/2008 |
| JP | 200970814 A | 4/2009 |
| JP | 2009099417 | 5/2009 |
| JP | 2009-283279 | 12/2009 |
| JP | 2010-80289 A | 4/2010 |
| JP | 2010-80293 A | 4/2010 |
| KR | 10-2007-0072400 | 7/2007 |
| KR | 10-2007-0116969 | 12/2007 |

(56) References Cited

FOREIGN PATENT DOCUMENTS

| WO | 2007019261 A1 | 2/2007 |
|----|---------------|--------|
| WO | 2010/084939 A1 | 7/2010 |
| WO | 2010098273 A1 | 9/2010 |

\* cited by examiner

ADHESIVE AND METHOD OF ENCAPSULATING ORGANIC ELECTRONIC DEVICE USING THE SAME

This application is a Continuation of U.S. patent application Ser. No. 14/289,212, filed May 28, 2014, now allowed, which is a Continuation of U.S. patent application Ser. No. 13/886,098 filed May 2, 2013, now U.S. Pat. No. 8,742,411 which is a Continuation Bypass of International Application No. PCT/KR2011/008280, filed Nov. 2, 2011, and claims the benefit of Korean Application Nos. 10-2010-0108113 filed on Nov. 2, 2010, 10-2011-0004054 filed on Jan. 14, 2011, and 10-2011-0113121 filed on Nov. 2, 2011, all of which are hereby incorporated by reference in their entirety for all purposes as if fully set forth herein.

BACKGROUND

1. Field of the Invention

The present invention relates to an adhesive and a method of encapsulating an organic electronic device (OED) using the same.

2. Discussion of Related Art

An organic electronic device (OED) refers to a device including an organic material layer that generates an alternating current with electric charges through the combination of holes and electrons, and examples of the OED may include a photovoltaic device, a rectifier, a transmitter and an organic light emitting diode (OLED).

Among the OEDs, the OLED has low power consumption and rapid response time and is desirable in manufacturing a thin display or lighting device, compared to a conventional light source. Also, the OLED is expected to be applied to various fields such as a variety of portable devices, monitors, notebook computers and televisions due to its excellent space accessibility.

Durability is one of the most important problems to be solved in order to commercialize an OLED and expand its use. An organic material and metal electrode included in the OLED are easily oxidized by external factors such as moisture. Thus, a product including the OLED is highly sensitive to environmental factors. Accordingly, a variety of methods have been proposed to effectively prevent oxygen or moisture from penetrating into an OED such as an OLED from the external environments.

A method of processing a metal can or a glass into a cap shape having a groove and loading the groove with a powdery dehumidifying agent to absorb moisture or manufacturing a metal can or a glass in the form of a film and sealing the film using a double-sided adhesive tape has been used in the art.

Japanese Patent Laid-Open Publication No. Hei9-148066 discloses an organic EL element including a stacked body having a structure in which an organic light emitting layer made of an organic compound is arranged between a pair of facing electrodes, an airtight container configured to protect the stacked body from the air, and a drying unit such as an alkaline metal oxide or an alkaline earth metal oxide arranged in the airtight container. However, such an organic EL element has problems in that the entire thickness of a display device is increased due to a shape of the airtight container, it is vulnerable to physical impacts due to the presence of the internal space, and its heat radiation property is poor when it is manufactured on a large scale.

U.S. Pat. No. 6,226,890 discloses a method of desiccating an electronic device including a desiccant layer formed using a desiccant and a binder, wherein the desiccant includes solid particle having a particle size of 0.1 to 200 µm. However, the desiccant layer has insufficient moisture absorption capacity. When a curable resin in a cured state does not meet a water vapor transmission rate (WVTR) of 50 g/m$^2$·day or less due to the characteristics of the binder surrounding a moisture absorbent, the curable resin does not exert sufficient performance because its moisture apposition rate actually increases during an acceleration test.

In order to solve these problems, Korean Patent Publication No. 2007-0072400 discloses an organic EL element. When an epoxy sealant includes a moisture absorbent, the epoxy sealant serves to chemically absorb moisture passed into the organic EL element and slow moisture penetration into the organic EL element. However, physical damage may be caused to the organic EL element due to volume expansion caused by reaction of the moisture absorbent with moisture. Also, when a metal oxide is used as the moisture absorbent, the metal oxide may react with moisture to generate a strongly basic substance, which causes chemical damage to a passivation layer and a cathode layer.

Therefore, there is a demand for development of an encapsulation material capable of effectively preventing penetration of moisture and also reducing damage to an OED.

SUMMARY OF THE INVENTION

The present invention is directed to an adhesive, and a product and method of encapsulating an organic electronic device (OED) using an adhesive.

One aspect of the present invention provides an adhesive for encapsulating an OED. Here, the adhesive includes a curable resin and moisture absorbent, the adhesive includes a first region coming in contact with the OED upon encapsulation of the OED, and a second region not coming in contact with the OED, and the moisture absorbent is present at contents of 0 to 20% and 80 to 100% in the first and second regions, respectively, based on the total weight of the moisture absorbent in the adhesive.

Another aspect of the present invention provides an encapsulated OED product including a substrate, an OED formed on the substrate and an adhesive for encapsulating the OED. Here, the first region of the adhesive covers the OED.

Still another aspect of the present invention provides a method of encapsulating an OED. Here, the method includes applying the adhesive to a substrate having the OED formed thereon so that the first region of the adhesive may cover the OED and curing the adhesive.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which.

DESCRIPTION OF REFERENCE NUMERALS

Figure 1:
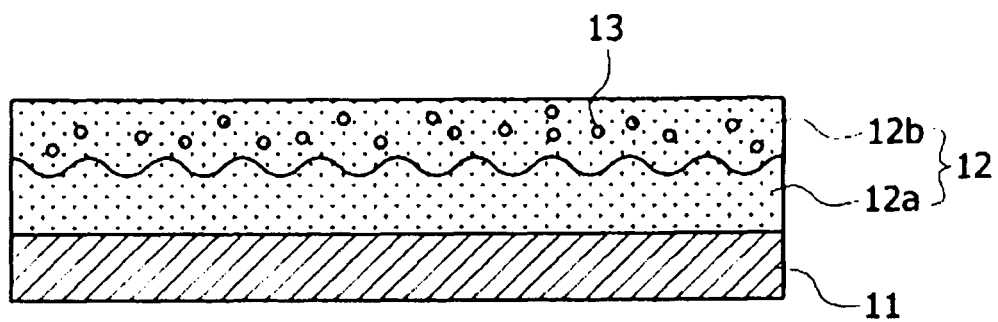
FIGS. 1 to 3 are cross-sectional views showing an adhesive film according to one exemplary embodiment of the present invention.

11: base film or release film
12: adhesive
14: cover film (base film or release film)
21: substrate
22: adhesive
12a: first region, 12b: second region
13, 23: moisture absorbent
24: cover substrate
25: organic electronic device
26: passivation film

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Although the terms first, second, etc. may be used to describe various elements, these elements are not limited by these terms. These terms are only used to distinguish one element from another. For example, a first element could be termed a second element, and, similarly, a second element could be termed a first element, without departing from the scope of exemplary embodiments. The term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of exemplary embodiments. The singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, components and/or groups thereof, but do not preclude the presence or addition of one or more other features, integers, steps, operations, elements, components and/or groups thereof.

With reference to the appended drawings, exemplary embodiments of the present invention will be described in detail below. To aid in understanding the present invention, like numbers refer to like elements throughout the description of the figures, and the description of the same elements will be not reiterated.

An adhesive according to one exemplary embodiment of the present invention serves to encapsulate an organic electronic device (OED), the adhesive having a multilayer structure. The adhesive according to the present invention may cover the entire surface of the organic electronic device (OED).

More particularly, the adhesive includes a curable resin and a moisture absorbent. Further, the adhesive includes a first region coming in contact with the OED upon encapsulation of the OED and a second region not coming in contact with the OED, and the moisture absorbent is present at contents of 0 to 20% and 80 to 100% in the first and second regions, respectively, based on the total weight of the moisture absorbent in the adhesive. The adhesive according to the present invention may be a curable hot-melt adhesive.

Throughout the specification, the term "organic electronic device (OED)" refers to a product or device having a structure including an organic layer which generates an alternating current with electric charges through the combination of holes and electrons between a pair of facing electrodes, and examples of the OED may include a photovoltaic device, a rectifier, a transmitter and an organic light emitting diode (OLED), but the present invention is not limited thereto. According to one exemplary embodiment of the present invention, the OED may be an OLED.

Throughout the specification, the term "hot-melt adhesive" refers to a kind of an adhesive that may maintain a solid or semi-solid phase at room temperature, attach a plate without bubbles due to flowability exerted when heat is applied, and strongly fix a subject using an adhesive when a curing reaction is completed. The adhesive according to the present invention may have a viscosity at room temperature of $10^6$ dyne/cm$^2$ or more, and preferably $10^7$ dyne/cm$^2$ or more. The term "room temperature" refers to a temperature at which an adhesive is not heated or cooled, for example, a temperature of approximately 15° C. to 35° C., more particularly approximately 20° C. to 25° C., and further particularly approximately 25° C. The viscosity may be measured using an advanced rheometric expansion system (ARES). According to the present invention, it is possible to facilitate processability in operations and encapsulate a plate with a uniform thickness during encapsulation of an OED by regulating the viscosity of a hot-melt adhesive within this viscosity range. Also, problems such as contraction and volatile gas generation which may be caused by curing of a resin may be remarkably reduced to prevent the physical or chemical damage to an organic electronic device. According to the present invention, as long as an adhesive is maintained in a solid or semi-solid phase at room temperature, an upper limit of the viscosity is not particularly limited. For example, the viscosity may be controlled to a range of approximately $10^9$ dyne/cm$^2$ or less in consideration of the processability.

Unlike the conventional techniques, according to exemplary embodiments of the present invention, the adhesive for encapsulating an OED has a multilayer structure, which includes a curable resin and moisture absorbent, and the adhesive further includes a first region coming in contact with the OED upon encapsulation of the OED, and a second region not coming in contact with the OED. Also, the moisture absorbent may be present at contents of 0 to 20% and 80 to 100% in the first and second regions, respectively, based on the total weight of the moisture absorbent in the adhesive. When the content of the moisture absorbent in the first region closer to the OED exceeds 20%, the volume expansion caused by reaction of the moisture absorbent with moisture may not be controlled using only a curing resin, which leads to increased cracks in a film of the OED.

The physical and chemical damage to the OED due to the presence of the moisture absorbent in the adhesive used as an encapsulation material may be prevented by controlling the content of the moisture absorbent in the adhesive having such a multilayer structure and the first and second regions.

Any method of forming an adhesive having a multilayer structure known in the art may be used without limitation as long as the method can divide the adhesive into first and second regions so that the first and second regions can have a multilayer structure.

Except for the content of the moisture absorbent, the first and second regions of the adhesive may have the same or different kinds and contents of the other components, for example, a curable resin, a moisture absorbent, other additives, or a filler. Unless defined otherwise herein, the following description is related to both the first and second regions of the adhesive.

The curable resin in a cured state may have a water vapor transmission rate (WVTR) of 50 g/m²·day or less, preferably 30 g/m²·day or less, more preferably 20 g/m²·day or less, and most preferably 15 g/m²·day or less. The term "cured state of a curable resin" refers to a state in which a curable resin may be cured or cross-linked alone or by reaction with another component such as a curing agent so that the curable resin can maintain constant contents of a moisture absorbent and a filler and serve as a structural adhesive when the curable resin is used as an encapsulation material. According to the present invention, the WVTR refers to a WVTR of a cured product which is measured at 38° C. and 100% relative humidity (R.H.) in a transverse direction when the cured product is formed by curing a curable resin and then processed into a film having a thickness of 80 µm. Also, the WVTR is measured according to the ASTM F1249 standard.

The WVTR may be controlled to effectively prevent penetration of moisture, humidity or oxygen into a product for encapsulating an OED (hereinafter referred to as an "OED-encapsulating product") and effectively introduce a moisture-reactive absorbent into the OED-encapsulating product.

According to the present invention, as the WVTR of a resin in a cured state is decreased, an encapsulation structure of the resin shows more excellent performance. Therefore, a lower limit of the WVTR is not particularly limited.

Specific kinds of the curable resin that may be used herein may, for example, include a variety of thermosetting or photocurable resins known in the art, but the present invention is not particularly limited thereto. The term "thermosetting resin" refers to a resin that may be cured by proper application of heat or through an aging process, and the term "photocurable resin" refers to a resin that may be cured by irradiation with electromagnetic waves. Also, a category of the electromagnetic waves described above may include a particle beam such as an α-particle beam, a proton beam, a neutron beam and an electron beam as well as microwaves, infrared rays (IR), ultraviolet rays (UV), X-rays and γ-rays. According to the present invention, one example of the photocurable resin may be a cation-photocurable resin. The cation-photocurable resin refers to a resin that may be cured by a cation polymerization or cation curing reaction induced by irradiation with electromagnetic waves. Also, the curable resin may be a dual curable resin showing both of the thermosetting and photocurable characteristics.

According to the present invention, specific kinds of the curable resin are not particularly limited as long as they have the above-described characteristics. For example, the curable resin that may be cured to give an adhesive property may include resins that contain at least one functional group which can be cured by heat, such as a glycidyl group, an isocyanate group, a hydroxyl group, a carboxyl group or an amide group, or contain at least one functional group which can be cured by irradiation with electromagnetic waves, such as an epoxide group, a cyclic ether group, a sulfide group, an acetal group or a lactone group. In addition, specific kinds of such a resin may include an acryl resin, a polyester resin, an isocyanate resin or an epoxy resin, but the present invention is not limited thereto.

According to the present invention, an aromatic or aliphatic epoxy resin or a linear or branched epoxy resin may be used as the curable resin. According to one exemplary embodiment of the present invention, an epoxy resin having an epoxy equivalent weight of 180 g/eq to 1,000 g/eq may be used as the epoxy resin containing at least two functional groups. The epoxy resin having the above-described epoxy equivalent weight range may be used to effectively maintain the characteristics such as adhesion and glass transition temperature of a cured product. Examples of such an epoxy resin may include a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenolmethane-type epoxy resin, an alkyl-modified triphenolmethane epoxy resin, a naphthalene-type epoxy resin, a dicyclopentadiene-type epoxy resin or a dicyclopentadiene-modified phenol-type epoxy resin, which may be used alone or in combination.

According to the present invention, an epoxy resin having a ring structure in the molecular structure may be preferably used, and an epoxy resin containing an aromatic group (for example, a phenyl group) may be more preferably used herein. When the epoxy resin contains an aromatic group, a cured product of the epoxy resin has excellent thermal and chemical stabilities and also shows low moisture absorption, which leads to improved reliability of an encapsulation structure of the OED. Specific examples of the aromatic group-containing epoxy resin that may be used herein may include, but are not limited to, a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloxy-based epoxy resin, a multifunctional epoxy resin, a phenol novolac epoxy resin, a triphenolmethane-type epoxy resin and an alkyl-modified triphenolmethane epoxy resin, which may be used alone or in combination.

According to the present invention, a silane-modified epoxy resin having a silane-modified epoxy resin, preferably an aromatic group, may be more preferably used as the epoxy resin. When the epoxy resin is structurally modified with silane so that it can have a silane group, it is possible to maximize an adhesive property to materials for a glass substrate or inorganic substrate of the OED and also improve properties such as a moisture barrier property, durability and reliability. Specific kinds of such an epoxy resin that may be used herein are not particularly limited, and the epoxy resin may be, for example, easily purchased from a manufacturer such as Kukdo Chemical Co., Ltd.

The adhesive according to the present invention includes a moisture absorbent in addition to the curable resin. The term "moisture absorbent" refers to a general component that can absorb or remove moisture or humidity, which is flowing in from the outside, by physical or chemical reaction. That is, the moisture absorbent means a moisture-reactive absorbent or physical absorbent, and a mixture thereof may also be used herein.

The moisture-reactive absorbent serves to absorb moisture or humidity by chemical reaction with humidity, moisture or oxygen introduced into an adhesive. The physical absorbent may suppress moisture or humidity from penetrating into an encapsulation structure by increasing a travel path of the moisture or humidity and maximize a barrier property to moisture and humidity by interaction with a matrix structure of the curable resin and a moisture-reactive absorbent.

According to one exemplary embodiment of the present invention, in order to avoid damage to the OED, the moisture absorbent may include a small amount of the moisture-reactive absorbent in the first region of the adhesive.

Specific kinds of the moisture absorbent that may be used herein are not particularly limited. For example, the moisture-reactive absorbent may include a metal powder, a metal oxide (e.g., alumina), a metal salt, phosphorus pentoxide ($P_2O_5$), or a mixture thereof, and the physical absorbent may include silica, zeolite, titania, zirconia or montmorillonite.

Specific examples of the metal oxide described above may include lithium oxide ($Li_2O$), sodium oxide ($Na_2O$), barium oxide (BaO), calcium oxide (CaO) or magnesium oxide (MgO), and examples of the metal salt may include, but are not limited to, a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride (CsF), tantalum fluoride ($TaF_5$), niobium fluoride ($NbF_5$), lithium bromide (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$).

According to the present invention, the moisture absorbent such as a metal oxide may be properly processed and blended with a composition. For example, the adhesive may be a thin film having a thickness of 30 μm or less according to the kind of the OED to which an adhesive is applied. In this case, a process of grinding a moisture absorbent is required. The grinding of the moisture absorbent may be performed using a process such as 3-roll milling, bead milling or ball milling. Also, when the adhesive of the present invention is used in top emission-type OEDs, the permeability of the adhesive itself is very important, and thus the moisture absorbent should be decreased in size. Thus, the grinding process may be required in such applications.

The second region of the adhesive according to the present invention may include the moisture absorbent at a content of 1 part by weight to 100 parts by weight, preferably 5 parts by weight to 50 parts by weight, based on 100 parts by weight of the curable resin. When the content of the moisture absorbent is controlled to more than 5 parts by weight, a cured product may show an excellent barrier property to moisture and humidity. In addition, when the content of the moisture absorbent is controlled to less than 50 parts by weight, a cured product may show an excellent barrier property to moisture when forming an encapsulation structure of a thin film.

Unless defined otherwise herein, the unit "parts by weight" refers to a weight ratio of each component.

Accordingly, the first region of the adhesive according to the present invention may also include the moisture absorbent at a content of 0 parts by weight to 20 parts by weight, based on 100 parts by weight of the curable resin. When the content of the moisture absorbent is 0 parts by weight, the moisture absorbent is not present in the first region of the adhesive, but is present only in the second region. When the content of the moisture absorbent is controlled to 20 parts by weight or less, it is possible to maximize a barrier property to moisture and also minimize physical and chemical damage to the OED caused by the presence of the moisture absorbent.

The adhesive according to the present invention may include a filler, preferably an inorganic filler. The filler may suppress moisture or humidity from penetrating into an encapsulation structure by increasing a travel path of the moisture or humidity, and maximize a barrier property to moisture and humidity by interaction with a matrix structure of the curable resin and a moisture-reactive absorbent. Specific kinds of the filler that may be used herein are not particularly limited. For example, clay, talc, acicular silica, or a mixture of at least one thereof may be used alone or in combination.

According to the present invention, in order to improve the efficiency of binding between a filler and an organic binder, a product surface-treated with an organic material may be used as the filler, or may also be used together with a coupling agent.

The adhesive according to the present invention may include the filler at a content of 1 part by weight to 50 parts by weight, preferably 1 part by weight to 20 parts by weight, based on 100 parts by weight of the curable resin. When the content of the filler is controlled to 1 part by weight or more, a cured product having an excellent barrier property to moisture or humidity and excellent mechanical properties may be provided. Also, when the content of the filler is controlled to 50 parts by weight or less according to the present invention, the curable resin may be prepared in the form of a film, and a cured product showing an excellent barrier property to moisture or humidity even when the curable resin is formed into a thin film may also be provided.

The adhesive according to the present invention may further include a curing agent which can react with a curable resin to form a matrix such as a cross-linking structure.

Specific kinds of the curing agent that may be used herein are not particularly limited, but may be properly selected according to the curable resins used, or the kinds of functional groups included in the curable resins. According to the present invention, for example, when an epoxy resin is used as the curable resin, a typical curing agent for epoxy resins known in the art may be used as the curing agent. More particularly, the curing agent may include, but is not limited to, various compounds such as an amine-based compound, an imidazole-based compound, a phenol-based compound, a phosphorus-based compound or an acid anhydride-based compound, which may be used alone or in combination.

The adhesive according to the present invention may, for example, include the curing agent at a content of 1 part by weight to 20 parts by weight, preferably 1 part by weight to 10 parts by weight, based on 100 parts by weight of the thermosetting resin. However, the content of the thermosetting resin is merely one exemplary embodiment of the present invention. That is, the content of the curing agent may be varied in the present invention according to the kind and content of the curable resins or their functional groups, the matrix structure to be realized, or the cross-linking density.

The adhesive according to the present invention may further include a high molecular weight resin. The high molecular weight resin may serve to improve formability when a composition according to the present invention is shaped in the form of a film or sheet. Also, the high molecular weight resin may serve as a high-temperature viscosity controlling agent for controlling the flowability during a hot-melting process.

Kinds of the high molecular weight resin that may be used herein are not particularly limited as long as they have compatibility with other components such as a curable resin. Specific examples of the high molecular weight resin that may be used herein may include, but are not limited to, resins having a weight average molecular weight of 20,000 or more, for example, a phenoxy resin, an acrylate resin, a high molecular weight epoxy resin, a super-high molecular weight epoxy resin, a high-polarity functional group-containing rubber and a high-polarity functional group-containing reactive rubber, which may be used alone or in combination.

When the high molecular weight resin is included in the adhesive according to the present invention, the content of the high molecular weight resin is controlled according to the desired physical properties, but the present invention is not particularly limited thereto. For example, according to the present invention, the high molecular weight resin may be included at a content of approximately 200 parts by weight or less, preferably 150 parts by weight or less, and more preferably approximately 100 parts by weight or less, based on 100 parts by weight of the curable resin. According to the present invention, when the content of the high molecular weight resin is controlled to 200 parts by weight or less, the high molecular weight may effectively maintain the compatibility with each component of a resin composition, and also function as an adhesive.

Also, the adhesive according to the present invention may further include an additional additive such as a filler for improving the durability of a cured product, a coupling agent for improving the mechanical and adhesive strengths, a UV stabilizer and an antioxidant, without departing from the scope of the present invention.

Another exemplary embodiment of the present invention is directed to an adhesive film. A structure of the adhesive film according to the present invention is not particularly limited as long as the structure of the adhesive film includes the adhesive including the first and second regions as described above. For example, the adhesive film according to the present invention may have a structure including a base film or release film (hereinafter referred to as a "first film"); and an adhesive formed on the base film or release film.

Also, the adhesive film according to the present invention may further include a base film or release film (hereinafter referred to as a "second film") formed on the adhesive.

Figure 2:
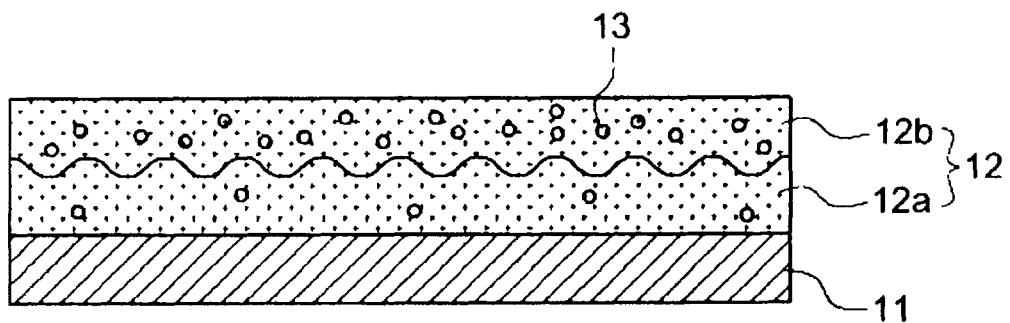
Figure 3:
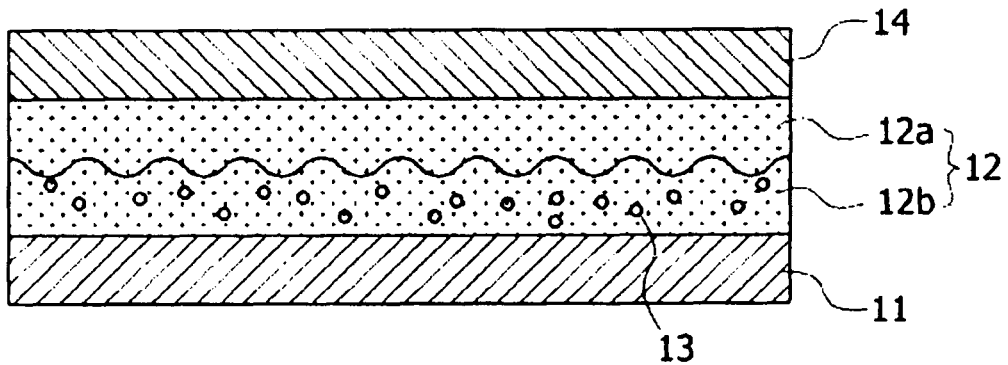

FIGS. 1 to 3 are cross-sectional views showing an adhesive film according to one exemplary embodiment of the present invention.

As shown in FIGS. 1 and 2, the adhesive film according to the present invention may include an adhesive 12 formed on a base film or release film 11. FIG. 1 shows that a moisture absorbent is present only in a second region of an adhesive according to the present invention, and FIG. 2 shows that a small amount of a moisture absorbent is also present in a first region.

According to another exemplary embodiment of the present invention, the adhesive film according to the present invention may further include a base film or release film 14 formed on the adhesive 12, as shown in FIG. 3. However, the adhesive film as shown in FIG. 3 is merely one exemplary embodiment of the present invention, and a stacking sequence of the first and second regions of the adhesive may be reversed, when necessary.

Specific kinds of the first film that may be used herein are not particularly limited. According to the present invention, a typical polymer film known in the art may, for example, be used as the first film. According to the present invention, the base film or release film that may be used herein may, for example, include a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-acrylic acid ethyl copolymer film, an ethylene-acrylic acid methyl copolymer film or a polyimide film. Also, one or both surfaces of the base film or release film according to the present invention may be subjected to adequate release treatment. Examples of a release agent used to release a base film may include an alkyd-based release agent, a silicone-based release agent, a fluorine-based release agent, an unsaturated ester-based release agent, a polyolefin-based release agent or a wax-based release agent. Among these, an alkyd-based, silicone-based or fluorine-based release agent may be preferably used in an aspect of heat resistance, but the present invention is not limited thereto.

Also, the kinds of second film (hereinafter also referred to as a "cover film") that may be used herein are not particularly limited. For example, according to the present invention, the same or different kind of the first film may be used as the second film when a range of the second film falls within the above-described range of the first film. According to the present invention, the second film may also be subjected to release treatment, and used.

According to the present invention, the thickness of such a base film or release film (a first film) is not particularly limited, and may be properly selected according to applications. According to the present invention, the thickness of the first film may be, for example, in a range of 10 µm to 500 µm, preferably 20 µm to 200 µm. When the thickness of the first film is less than 10 µm, a base film may be easily deformed during a manufacturing process, whereas an economical efficiency may be degraded when the thickness of the first film exceeds 500 µm.

According to the present invention, the thickness of the second film is not particularly limited. According to the present invention, the thickness of the second film may be, for example, set to the same thickness as the first film. According to the present invention, the thickness of the second film may also be set to a relatively smaller thickness than the first film in consideration of the process ability.

The thickness of the adhesive included in the adhesive film according to the present invention is not particularly limited, but may be properly selected according to the following conditions in consideration of applications of the adhesive film. However, the first region of the adhesive preferably has a smaller thickness than the second region. For the adhesive included in the adhesive film according to the present invention, for example, the first region of the adhesive may have a thickness of 1 µm to 20 µm, preferably 2 µm to 15 µm. When the thickness of the first region is less than 1 µm, the ability of the second region of the adhesive to protect the OED from damage factors may be degraded, for example, even when the adhesive film is used as an encapsulation material for OEDs. When the thickness of the first region exceeds 20 µm, the ability of the second region of the adhesive to prevent penetration of moisture may be degraded. The second region of the adhesive may have a thickness of 5 µm to 200 µm, preferably 5 µm to 100 µm. When the thickness of the second region is less than 5 µm, the ability to prevent penetration of moisture may be insufficient. When the thickness of the second region exceeds 200 µm, it is difficult to secure the processability, damage may be caused to a deposited film of an organic EL element as the expansion in thickness is increased due to the reactivity with moisture, and the economical efficiency may be degraded.

According to the present invention, a method of manufacturing such an adhesive film is not particularly limited. For example, each of the first and second regions of the adhesive may be prepared using a method including a first operation of coating a base film or release film with a coating solution including a composition of the above-described adhesive; and a second operation of drying the coating solution coated in the first operation.

Also, a method of stacking each of the first and second regions is not particularly limited. For example, an adhesive film having a multilayer structure may be formed by joining first and second regions formed respectively on separate release films to each other, and a second region may be directly formed on a first region, or vice versa.

Also, the method of manufacturing an adhesive film according to the present invention may further include a third operation of further compressing the base film or release film onto the coating solution dried in the second operation.

The first operation according to the present invention is to prepare a coating solution by dissolving or dispersing the above-described composition of the adhesive in a proper solvent. In this procedure, the content of the epoxy resin included in the coating solution may be properly controlled according to the desired properties such as a barrier property to moisture and film formability.

According to the present invention, kinds of the solvent used in preparation of the coating solution are not particularly limited. However, when a drying time of the solvent is too long, or the solvent is dried at a high temperature, the workability or the durability of the adhesive may be deteriorated. Therefore, the use of a solvent having an evaporation temperature of 100° C. or lower is preferred. According to the present invention, a small amount of the solvent having an evaporation temperature greater than this temperature range may be used in consideration of the film formability. Examples of the solvent that may be used herein may include, but are not limited to, methylethylketone (MEK), acetone, toluene, dimethylformamide (DMF), methylcellosolve (MCS), tetrahydrofuran (THF) or N-methylpyrrolidone (NMP), which may be used alone or in combination.

In the first operation of the present invention, a method of coating a base film or release film with such a coating solution is not particularly limited. For example, a known method such as knife coating, roll coating, spray coating, gravure coating, curtain coating, comma coating or lip coating may be used without limitation.

The second operation of the present invention is to form an adhesive by drying the coating solution coated in the first operation. That is, in the second operation of the present invention, an adhesive may be formed by heating the coating solution coated on the film to dry the film and remove the solvent. In this case, the drying conditions are not particularly limited. For example, the drying process may be performed at a temperature of 70° C. to 200° C. for 1 to 10 minutes.

In the method of manufacturing an adhesive film according to the present invention, a third operation of compressing an additional base film or release film onto the adhesive formed on the film may be further performed after the second operation.

Such a third operation of the present invention may be performed by compressing an additional release film or base film (a cover film or second film) onto the dried adhesive after coating the film using a hot-roll lamination or press process. In this case, the third operation may be performed using a hot-roll lamination process in aspects of the probability and efficiency of a continuous process. In this case, the process may be performed at a temperature of approximately 10° C. to 100° C. and a pressure of approximately 0.1 kgf/cm$^2$ to 10 kgf/cm$^2$.

Another exemplary embodiment of the present invention is directed to providing an encapsulated OED product including a substrate, an OED formed on the substrate, and an adhesive described above for encapsulating the OED. Here, a first region of the adhesive covers the OED.

According to the present invention, the OED may be an organic light emitting diode (OLED).

The encapsulated OED product may further include a passivation film formed between the adhesive and the OED for protecting the OED.

Still another exemplary embodiment of the present invention is directed to providing a method of encapsulating an OED including applying an adhesive to a substrate having the OED formed thereon so that a first region of the adhesive may cover the OED; and curing the adhesive.

An operation of applying the adhesive to the OED may be performed by subjecting the adhesive film to a hot-roll lamination, hot press or vacuum press method, but the present invention is not particularly limited thereto.

The operation of applying the adhesive to the OED may be performed at a temperature of 50° C. to 90° C., and the curing may be performed by heating the adhesive at a temperature of 70° C. to 110° C. or irradiating the adhesive with UV rays.

Also, the method of encapsulating an OED may further include attaching a second region of the adhesive to an additional encapsulation material such as a glass or a metal so that the second region and the encapsulation material can come in contact with each other.

Figure 4:
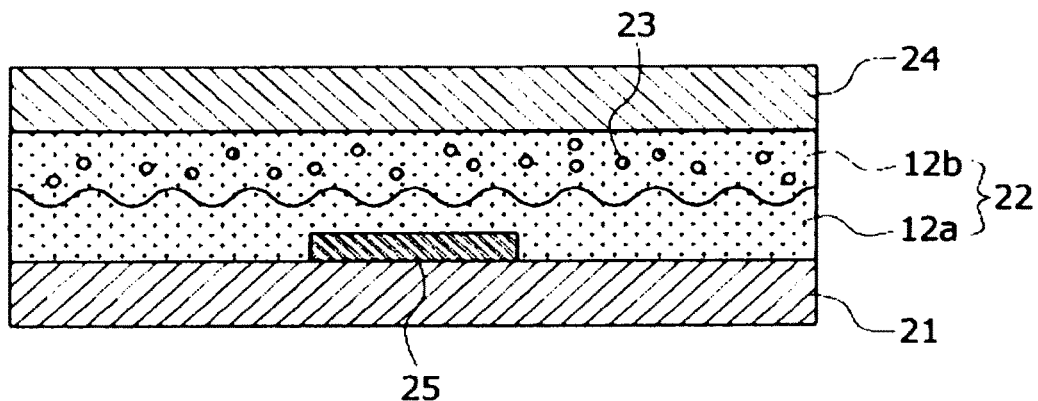
FIGS. 4 and 5 are cross-sectional views showing an encapsulated OED product according to one exemplary embodiment of the present invention.
Figure 5:
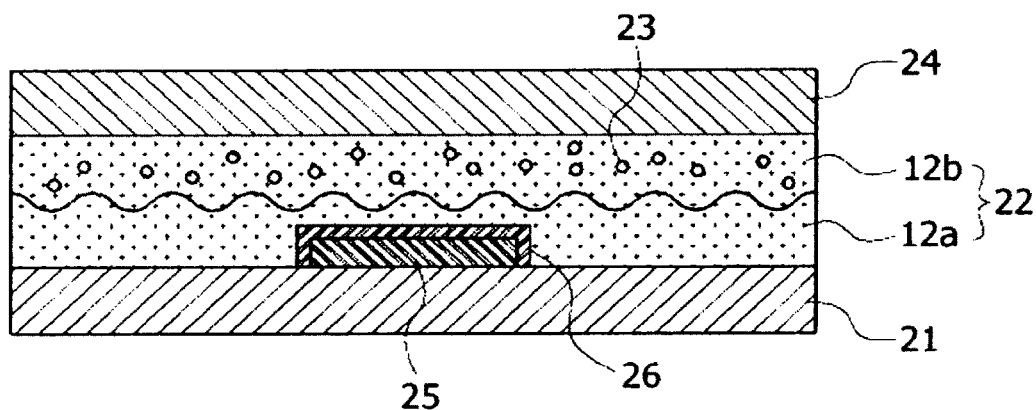

FIG. 4 is a cross-sectional view of an encapsulated OED product according to one exemplary embodiment of the present invention.

In the method of encapsulating an OED according to the present invention, for example, a transparent electrode is formed on a substrate 21 such as a glass or polymer film using a method such as vacuum deposition or sputtering, and an organic layer is formed on the transparent electrode. The organic layer may include a hole injection layer, a hole transfer layer, a light emitting layer, an electron injection layer and/or an electron transfer layer. Next, a second electrode is further formed on the organic layer. Thereafter, the above-described adhesive 22 is applied onto the OED 25 formed on the substrate 21 so that the adhesive 22 can cover the entire organic electronic device 25. In this case, a method of applying the adhesive 22 is not particularly limited. For example, a cover substrate (e.g., a glass or polymer film) 24 to which the adhesive of the adhesive film according to the present invention has been previously transferred may be applied onto the OED 25 formed on the substrate 21 using a method such as heating or compression. In this operation, for example, when the adhesive 22 is transferred onto the cover substrate 24, the above-described adhesive according to the present invention may be transferred onto the cover substrate 24 using a vacuum press or vacuum laminator while the base film or release film formed on the adhesive is peeled off and heated. In this procedure, when the curing of the adhesive is carried out to an extent exceeding a certain range, the close adhesion and adhesive strength of the adhesive 22 may be degraded. Thus, it is desirable to control a process temperature and a processing time to approximately 100° C. or lower and 5 minutes, respectively. Similarly, when the cover substrate 24 to which the adhesive 22 is transferred is thermally compressed to the OED, a vacuum press or vacuum laminator may be used. In this operation, the temperature condition may be set as described above, and the processing time may be set to less than 10 minutes. However, the adhesive is applied to the OED so that the adhesive of the first region rather than the second region of the adhesive can come in contact with the OED (in contact with a passivation film when the OED includes the passivation film).

According to the present invention, the adhesive to which the OED is compressed may also be further subjected to a curing process. In this case, the curing process (the inventive curing) may be, for example, performed in a heating chamber or a UV chamber. The conditions in the inventive curing may be properly selected in consideration of the stability of the OED.

However, the above-described manufacturing process is merely one exemplary embodiment for encapsulating the OED according to the present invention. Thus, the process sequence and process conditions may be easily changed. For example, the sequence of the transfer and compressing process may be changed in the present invention in such a manner that the adhesive 22 according to the present invention is first transferred onto the OED 25 formed on the substrate 21 and the cover substrate 24 is compressed. Also, when a passivation layer is formed on the OED 25, the adhesive 22 may be applied to the passivation layer, and cured without forming the cover substrate 24.

Example 1

1. Preparation of Solution for First Region 200 g of a silane-modified epoxy resin (KSR-177, Kukdo Chemical Co., Ltd.) and 150 g of a phenoxy resin (YP-50, Tohto Kasei Co. Ltd.) were put into a reactor, and diluted with MEK. Thereafter, the inside of the reactor was replaced with nitrogen, and the resulting solution was homogenized.

2. Preparation of Solution for Second Region 70 g of CaO (Aldrich) was added as a moisture absorbent at a concentration of 30% by weight to MEK to prepare a moisture absorbent solution, and the moisture absorbent solution was milled for 24 hours using a ball mill process. Also, as a separate process, 200 g of a silane-modified epoxy resin (KSR-177, Kukdo Chemical Co., Ltd.) and 150 g of a phenoxy resin (YP-50, Tohto Kasei Co., Ltd.) were put into a reactor at room temperature, and diluted with MEK. Thereafter, the inside of the reactor was replaced with nitrogen, and the resulting solution was homogenized. The moisture absorbent solution as previously prepared above was added to the homogenized solution, and 4 g of a curing agent, imidazole (Shikoku Chemicals Corporation), was added, and stirred at a high speed for 1 hour to prepare a solution for a second region.

3. Preparation of Adhesive Film

The solution for a first region as previously prepared above was applied to a released surface of a release PET film using a comma coater, and dried at 130° C. for 3 minutes in an oven to form an adhesive layer having a thickness of 15 μm.

The solution for a second region as previously prepared above was applied to a released surface of a release PET film using a comma coater, and dried at 130° C. for 3 minutes in an oven to form an adhesive layer having a thickness of 15 μm.

The adhesive layers of the first and second regions were joined together to manufacture a multilayer adhesive film.

Example 2

An adhesive film having a multilayer structure was manufactured in the same manner as in Example 1, except that 7 g of CaO was added to the first region solution and 62 g of CaO was added to the second region solution in the manufacture of the adhesive film of Example 1.

Example 3

An adhesive film having a multilayer structure was manufactured in the same manner as in Example 1, except that 14 g of CaO was added to the first region solution and 56 g of CaO was added to the second region solution in the manufacture of the adhesive film of Example 1.

Comparative Example 1

An adhesive film having a thickness of 45 μm was manufactured in the same manner as in the manufacture of the adhesive film of Example 1, except that only compositions of the first region solution prepared in Example 1 were used.

Comparative Example 2

An adhesive film having a thickness of 45 μm was manufactured in the same manner as in the manufacture of the adhesive film of Example 1, except that only compositions of the second region solution prepared in Example 1 were used.

Comparative Example 3

An adhesive film having a multilayer structure was manufactured in the same manner as in Example 1, except that 28 g of CaO was added to the first region solution and 42 g of CaO was added to the second region solution in the manufacture of the adhesive film of Example 1.

Comparative Example 4

An adhesive film having a multilayer structure was manufactured in the same manner as in Example 1, except that the silane-modified epoxy resin was exchanged with an acryl pressure-sensitive adhesive resin in the manufacture of the adhesive film of Example 1.

Comparative Example 5

An adhesive film having a multilayer structure was manufactured in the same manner as in Example 1, except that the silane-modified epoxy resin was exchanged with a butadiene-modified epoxy resin in the manufacture of the adhesive film of Example 1.

Experimental Example 1: Confirmation of Moisture Barrier Property

In order to examine the barrier properties of the adhesive films manufactured in Examples 1 to 3 and Comparative Examples 1 to 5, a calcium test was carried out. More particularly, calcium (Ca) was deposited on a glass substrate having a size of 100 mm×100 mm to form 9 spots with a size of 5 mm×5 mm and a thickness of 100 nm, and a cover glass to which each of the adhesive films of Examples 1 to 3 and Comparative Examples 1 to 3 was transferred was heated at each calcium-deposited spot at 80° C. for 1 minute using a vacuum press method. Then, each of the adhesive films was cured at 100° C. for 3 hours in a high-temperature oven, and the encapsulated Ca test sample was then cut into pieces with a size of 11 mm×11 mm. The obtained test samples were kept under conditions of a temperature of 85° C. and 85% R.H. in a constant temperature and humidity chamber, and a time point where a Ca-containing coating solution started to show transparency due to an oxidation reaction with penetrating moisture was determined. The results are listed in the following Table 1.

TABLE 1

| Items | Examples | | | Comparative Examples | | | | |
|---|---|---|---|---|---|---|---|---|
| | 1 | 2 | 3 | 1 | 2 | 3 | 4 | 5 |
| Time at which transparency is shown (hours) | <240 | <250 | <270 | <40 | <230 | <250 | <24 | <110 |

Experimental Example 2: Confirmation of Moisture Barrier Property

The curable resins in the adhesive films manufactured in Example 1 and Comparative Examples 4 to 5 were measured for WVTR. The WVTR measurement was performed by curing a silane-modified epoxy resin, an acryl pressure-sensitive adhesive resin and a butadiene-modified epoxy resin to form films having a thickness of 80 μm and measuring WVTRs of the films in a transverse direction at 38° C. and 100% R.H. using equipment commercially available from MOCON. The results are listed in the following Table 2.

TABLE 2

| | Example 1 | Comparative Examples | |
|---|---|---|---|
| | | 4 | 5 |
| WVTR (g/m² · day) | 11 | 250 | 80 |

Experimental Example 3: Confirmation of Physical Damage

The adhesive films of Examples 1 to 3 and Comparative Examples 1 to 3 were used to manufacture 3-inch organic light emitting panels. Then, the organic light emitting panels were kept under the conditions of a temperature of 85° C. and 85% R.H. in a constant temperature and humidity chamber, and damage to the organic deposited films was observed. The results are listed in the following Table 3.

TABLE 3

| Items | Film damage |
|---|---|
| Example 1 | No damage |
| Example 2 | No damage |
| Example 3 | No damage |
| Comparative Example 1 | No damage |
| Comparative Example 2 | Organic deposited films are broken in the interface between a moisture-permeable region and a moisture-impermeable region |
| Comparative Example 3 | Adhesive failure occurs |

Experimental Example 4: Confirmation of Chemical Damage

Figure 6:
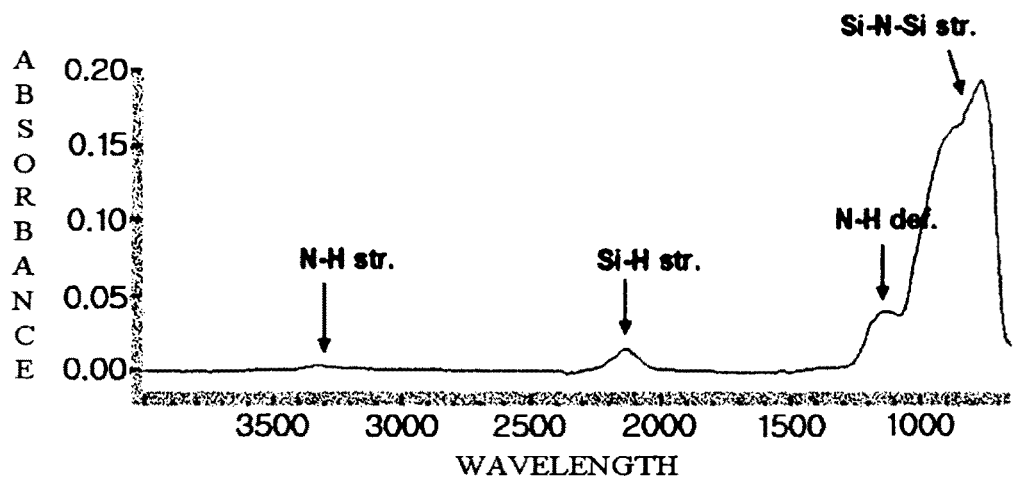
FIG. 6 shows the Fourier transform infrared (FT-IR) analysis results of an adhesive film manufactured in Example 1.
Figure 7:
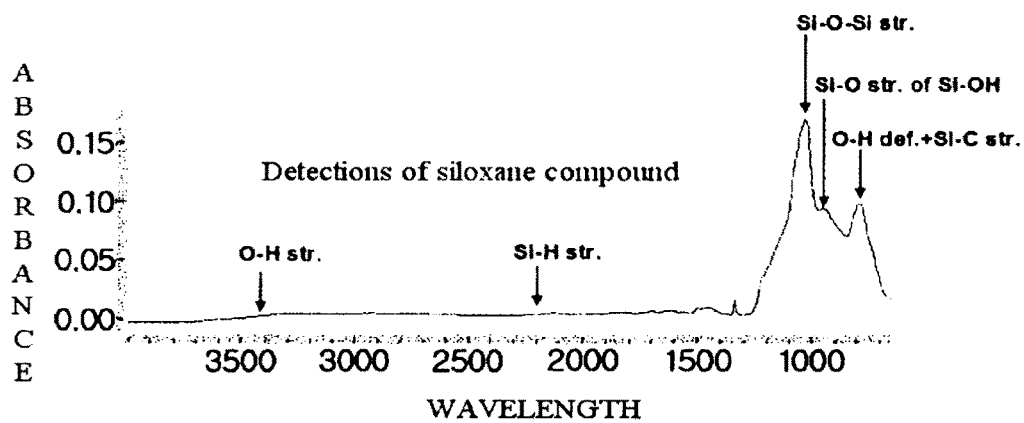
FIG. 7 shows the FT-IR analysis results of an adhesive film manufactured in Comparative Example 2.

Silicon nitride (SiNx) used for a passivation film in the OED was deposited on a glass to a thickness of 1 μm. Each of the adhesive films of Examples 1 to 3 and Comparative Examples 1 to 3 was thermally compressed onto the SiNx-deposited film, cured, and kept under the conditions of a temperature of 85° C. and 85% R.H. Thereafter, a chemical change in the SiNx deposited film was analyzed using a Fourier transform infrared (FT-IR) spectroscope. The results are listed in the following Table 4, and the FT-IR analysis results on the adhesive films of Example 1 and Comparative Example 2 are shown in FIGS. 6 and 7. Unlike FIG. 6, it was analyzed that a change in chemical components of the SiNx-deposited film took place as shown in FIG. 7. Thus, it was confirmed that the chemical damage to the passivation film (the SiNx-deposited film) took place since a moisture-reactive absorbent served as a strong alkali due to hydration.

TABLE 4

| | Film damage |
|---|---|
| Example 1 | No damage |
| Example 2 | No damage |
| Example 3 | No damage |
| Comparative Example 1 | No damage |
| Comparative Example 2 | Passivation film is chemically damaged |
| Comparative Example 3 | Passivation film is chemically damaged upon exposure to extreme environments |

As described above, it could be confirmed that the adhesive films of Examples 1 to 3 according to the exemplary embodiments of the present invention may serve to effectively encapsulate the OED from moisture, but effective encapsulation of the OED is not attained when the first and second regions are not demarcated in the adhesive film or at least a certain content of the moisture absorbent is included in the first region.

The adhesive film according to the present invention may be useful in effectively preventing moisture or oxygen flowing in the OED from penetrating from the outside and also improving the lifespan and durability of the OED.

While the invention has been shown and described with reference to certain exemplary embodiments thereof, it will be understood by those skilled in the art that various changes in form and details may be made therein without departing from the spirit and scope of the invention as defined by the appended claims.

What is claimed is:
1. An adhesive comprising:
a curable resin, and
a moisture absorbent,
wherein the adhesive comprises a first region in direct contact with an organic electronic device (OED) upon encapsulation of the OED, and a second region not coming in contact with the organic electronic device (OED), wherein the moisture absorbent is present at contents of 0 to 20% and 80 to 100% in the first and second regions, respectively, based on the total weight of the moisture absorbent in the adhesive, and wherein the first region comprises an inorganic filler.

2. The adhesive of claim 1, wherein the curable resin has a water vapor transmission rate (WVTR) of 50 g/m²·day or less when measured in a cured state.

3. The adhesive of claim 1, wherein the curable resin is a thermosetting resin, a photocurable resin or a dual curable resin.

4. The adhesive of claim 1, wherein the curable resin contains at least one curable functional group selected from the group consisting of a glycidyl group, an isocyanate group, a hydroxyl group, a carboxyl group, an amide group, an epoxide group, a cyclic ether group, a sulfide group, an acetal group and a lactone group.

5. The adhesive of claim 1, wherein the curable resin is an epoxy resin having a ring structure in the molecular structure.

6. The adhesive of claim 1, wherein the curable resin is a silane-modified epoxy resin.

7. The adhesive of claim 1, wherein the moisture absorbent is a moisture-reactive absorbent, a physical absorbent, or a mixture thereof.

8. The adhesive of claim 7, wherein the moisture-reactive absorbent is selected from the group consisting of alumina, metal oxide, metal salt and phosphorus pentoxide, and the physical absorbent is selected from the group consisting of silica, zeolite, zirconia, titania and montmorillonite.

9. The adhesive of claim 8, wherein the moisture-reactive absorbent is at least one selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

10. The adhesive of claim 1, wherein the second region of the adhesive comprises 1 to 100 parts by weight of the moisture absorbent, based on 100 parts by weight of the curable resin.

11. The adhesive of claim 1, wherein the first region of the adhesive comprises 0 to 20 parts by weight of the moisture absorbent, based on 100 parts by weight of the curable resin.

12. The adhesive of claim 1, wherein the second region further comprises an inorganic filler.

13. The adhesive of claim 12, wherein each of the inorganic filler in the first region and the second region is at least one selected from the group consisting of clay, talc and acicular silica.

14. The adhesive of claim 12, wherein the adhesive comprises 1 to 50 parts by weight of the filler, based on 100 parts by weight of the curable resin.

15. The adhesive of claim 1, wherein the adhesive further comprises a curing agent.

16. The adhesive of claim 15, wherein the curing agent is selected from the group consisting of an amine-based compound, an imidazole-based compound, a phenol-based compound, a phosphorus-based compound and an acid anhydride-based compound.

17. The adhesive of claim 15, wherein the adhesive comprises 1 to 10 parts by weight of the curing agent, based on 100 parts by weight of the curable resin.

18. The adhesive of claim 1, wherein the adhesive further comprises a film formability improving resin having a weight average molecular weight of 20,000 or more.

19. The encapsulated organic electronic device (OED) on a substrate comprising:

the adhesive defined in claim 1 for encapsulating the organic electronic device (OED), wherein the first region of the adhesive covers the organic electronic device (OED).

20. The product of claim 19, wherein the organic electronic device is an organic light emitting diode (OLED).

21. The product of claim 19, wherein the organic electronic device (OED) comprises a passivation layer.

22. A method of encapsulating an organic electronic device (OED), comprising:

applying the adhesive defined in claim 1 to a substrate having the organic electronic device (OED) formed thereon so that the first region of the adhesive covers the organic electronic device (OED); and curing the adhesive.

23. The method of claim 22, wherein the application of the adhesive to the organic electronic device is performed by subjecting the adhesive to a hot-roll lamination, hot press or vacuum press method.

24. The method of claim 22, wherein the application of the adhesive to the organic electronic device is performed at a temperature of 50 to 90° C.

25. The method of claim 22, wherein the curing of the adhesive is performed by heating the adhesive in a temperature range of 70 to 110° C. or irradiating the adhesive with UV rays.

26. The method of claim 22, wherein the organic electronic device (OED) comprises a passivation layer.

27. The adhesive of claim 1, wherein the adhesive has a viscosity of $10^6$ dynes/cm² or more at room temperature.

* * * * *